United States Patent
Feng et al.

(10) Patent No.: US 9,929,162 B1
(45) Date of Patent: Mar. 27, 2018

(54) SEMICONDUCTOR DEVICE AND METHOD FOR FORMING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Li-Wei Feng, Kaohsiung (TW); Ying-Chiao Wang, Changhua County (TW); Yu-Chieh Lin, Kaohsiung (TW); Chien-Ting Ho, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/456,564

(22) Filed: Mar. 12, 2017

(30) Foreign Application Priority Data

Dec. 22, 2016 (CN) .......................... 2016 1 1197883

(51) Int. Cl.
*H01L 27/10* (2006.01)
*H01L 27/108* (2006.01)

(52) U.S. Cl.
CPC .. *H01L 27/10855* (2013.01); *H01L 27/10814* (2013.01); *H01L 27/10823* (2013.01); *H01L 27/10876* (2013.01); *H01L 27/10885* (2013.01)

(58) Field of Classification Search
CPC ......... H01L 27/10855; H01L 27/10814; H01L 27/10823; H01L 27/10876; H01L 27/10885
See application file for complete search history.

(56) References Cited

U.S. PATENT DOCUMENTS

| | | | | |
|---|---|---|---|---|
| 8,003,514 B2* | 8/2011 | Kim | .................. | H01L 27/10855 257/E21.495 |
| 2005/0001253 A1* | 1/2005 | Sugimura | ......... | H01L 21/76804 257/296 |
| 2008/0284029 A1 | 11/2008 | Kim et al. | | |
| 2012/0012912 A1* | 1/2012 | Kwon | ............... | H01L 27/10823 257/302 |
| 2013/0320436 A1* | 12/2013 | Kim | ........................ | H01L 29/78 257/330 |
| 2013/0328196 A1* | 12/2013 | Sun | .................. | H01L 27/10852 257/751 |
| 2014/0361403 A1* | 12/2014 | Cho | ...................... | H01L 21/764 257/532 |
| 2015/0056801 A1* | 2/2015 | Park | .................. | H01L 21/76814 438/655 |

* cited by examiner

*Primary Examiner* — Nicholas Tobergte
(74) *Attorney, Agent, or Firm* — Winston Hsu

(57) ABSTRACT

A semiconductor device include a substrate including at least a memory cell region formed thereon, an isolation mesh formed on the substrate; and a plurality of storage node contact plugs. The semiconductor device includes a plurality of memory cells formed in the memory cell region. The isolation mesh includes a plurality of essentially homogeneous dielectric sidewalls and a plurality of first apertures defined by the dielectric sidewalls. The storage node contact plugs are respectively formed in the first apertures, and electrically connected to the memory cells respectively.

18 Claims, 17 Drawing Sheets

SEMICONDUCTOR DEVICE AND METHOD FOR FORMING THE SAME

BACKGROUND OF THE INVENTION

1. Field of the Invention

The present invention relates to a semiconductor device and a method for forming the same, and more particularly, to a semiconductor memory device and a method for forming the same.

2. Description of the Prior Art

Dynamic random access memory (hereinafter abbreviated as DRAM) is a volatile memory that commonly used as system memory. A memory cell array of DRAM has a configuration in which memory cells, each including an access metal oxide semiconductor (hereinafter abbreviated as MOS) transistor and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors. The two basic types of stacked capacitor DRAM cells of the prior art are the capacitor over bit line (hereinafter abbreviated as COB) and capacitor under bit line (CUB).

As memory cells of DRAM become more integrated and miniaturized, overlay margin between the contact plugs for providing electrical connection to the storage node and to the bit line is reduced. That is, process issue is caused. Therefore DRAM designs for improving DRAM performance and method for improving process yield are still in need.

SUMMARY OF THE INVENTION

According to an aspect of the present invention, a semiconductor device is provided. The semiconductor device includes a substrate including at least a memory cell region defined therein, an isolation mesh formed on the substrate, and a plurality of storage node contact plugs. The semiconductor device includes a plurality of memory cells formed in the memory cell region. The isolation mesh includes a plurality of essentially homogeneous dielectric sidewalls and a plurality of first apertures defined by the dielectric sidewalls. The storage node contact plugs are formed in the first apertures and electrically connected to the memory cells, respectively.

According to an aspect of the present invention, a method for forming a semiconductor device is provided, and the method includes following steps. A substrate including at least a memory cell region defined therein is provided, and a plurality of memory cells are formed in the substrate. The substrate includes a first insulating layer formed thereon and a plurality of bit line structures formed in the first insulating layer in the memory cell region. The first insulating layer includes a first insulating material. The bit line structures are extended along a first direction and arranged along a second direction, and the first direction and the second direction are perpendicular to each other. Next, a plurality of first mask patterns are formed on the substrate, and the first mask patterns are extended along the second direction and arranged along the first direction to form a plurality of first exposed portions of the first insulating layer. Subsequently, the first exposed portions of the first insulating layer are removed to form a plurality of openings in the first insulating layer. After forming the openings, a second insulating layer is formed on the substrate to fill up the openings and to form a plurality of second exposed portions of the first insulating layer, and the second insulating layer includes a second insulating material different from the first insulating material. Thereafter, the second exposed portions of the first insulating layer are removed to form an isolation mesh on the substrate, and the isolation mesh includes a plurality of essentially homogeneous dielectric sidewalls and a plurality of apertures defined by the dielectric sidewalls. After forming the apertures, a plurality of storage node contact plugs are formed in the apertures, respectively.

According to the semiconductor device and the method for forming the same provided by the present invention, the isolation mesh including the apertures formed therein is formed on the substrate, and the storage node contact plugs are subsequently formed in the apertures in the isolation mesh. Since the storage node contact plugs are formed in the apertures defined by the isolation mesh, the storage node contact plugs are physically spaced apart and electrically isolated from the bit line contact plugs and the bit lines by the isolation mesh. Briefly speaking, according to the method for forming the semiconductor device provided by the present invention, process yield is improved. More important, the semiconductor device provided by the present invention includes superior performance even when DRAM become more integrated and miniaturized.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-7 are schematic drawings illustrating a method for forming a semiconductor device provided by a first preferred embodiment of the present invention, wherein FIGS. 1A-6A are plan views illustrating the method for forming the semiconductor device provided by the first preferred embodiment; and FIGS. 1B-6B are cross-sectional views taken along a Line A-A' of FIGS. 1A-6A, respectively.

FIGS. 1A-4B and 8A-9B are schematic drawings illustrating a method for forming a semiconductor device provided by a second preferred embodiment of the present invention, wherein FIGS. 1A-4A and 8A-9A are plan views illustrating the method for forming the semiconductor device provided by the second preferred embodiment; and FIGS. 1B-4B and 8B-9B are cross-sectional views taken along a Line B-B' of FIGS. 1A-4A and 8A-9A, respectively.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1A:
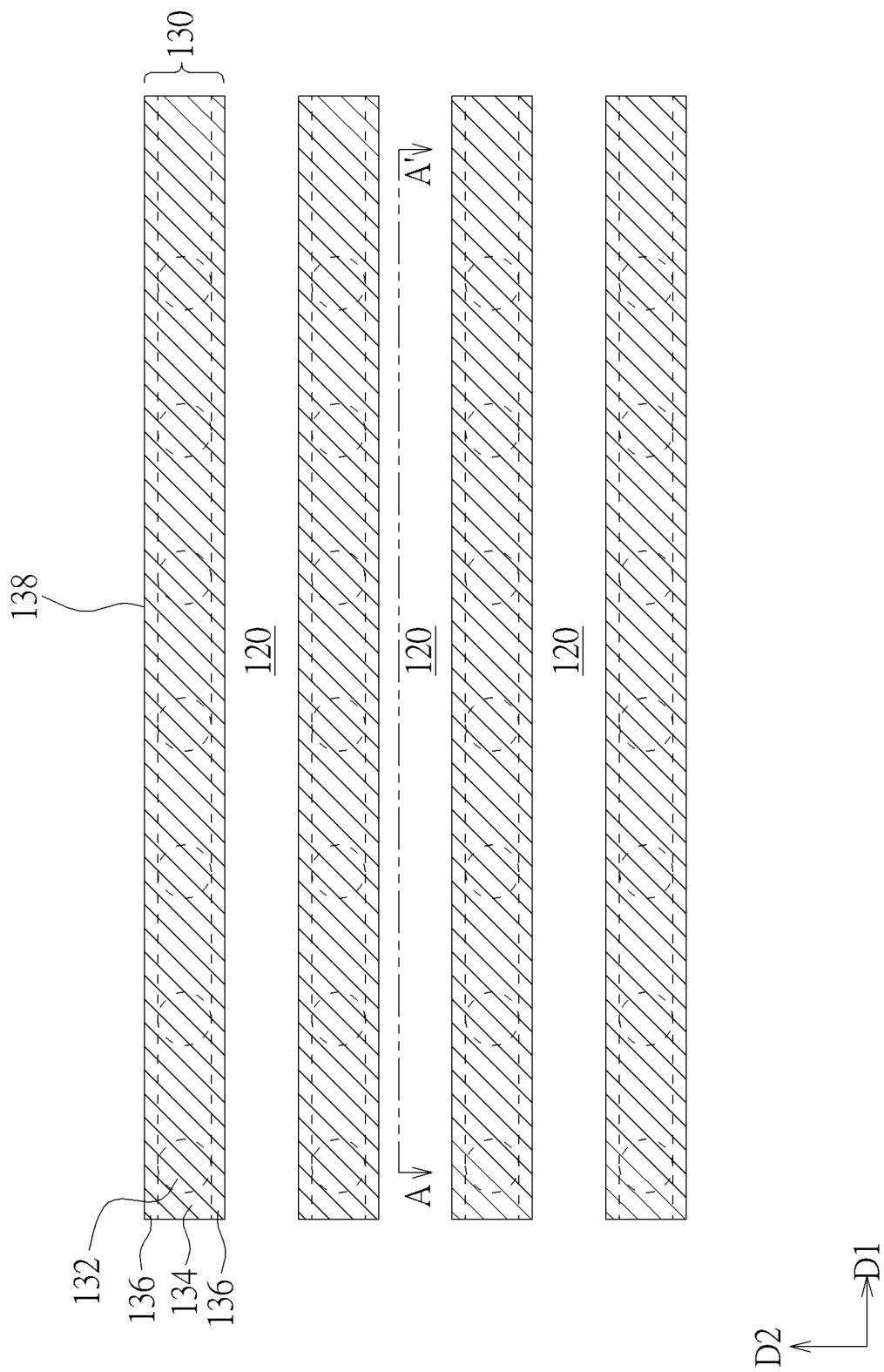
Figure 1B:
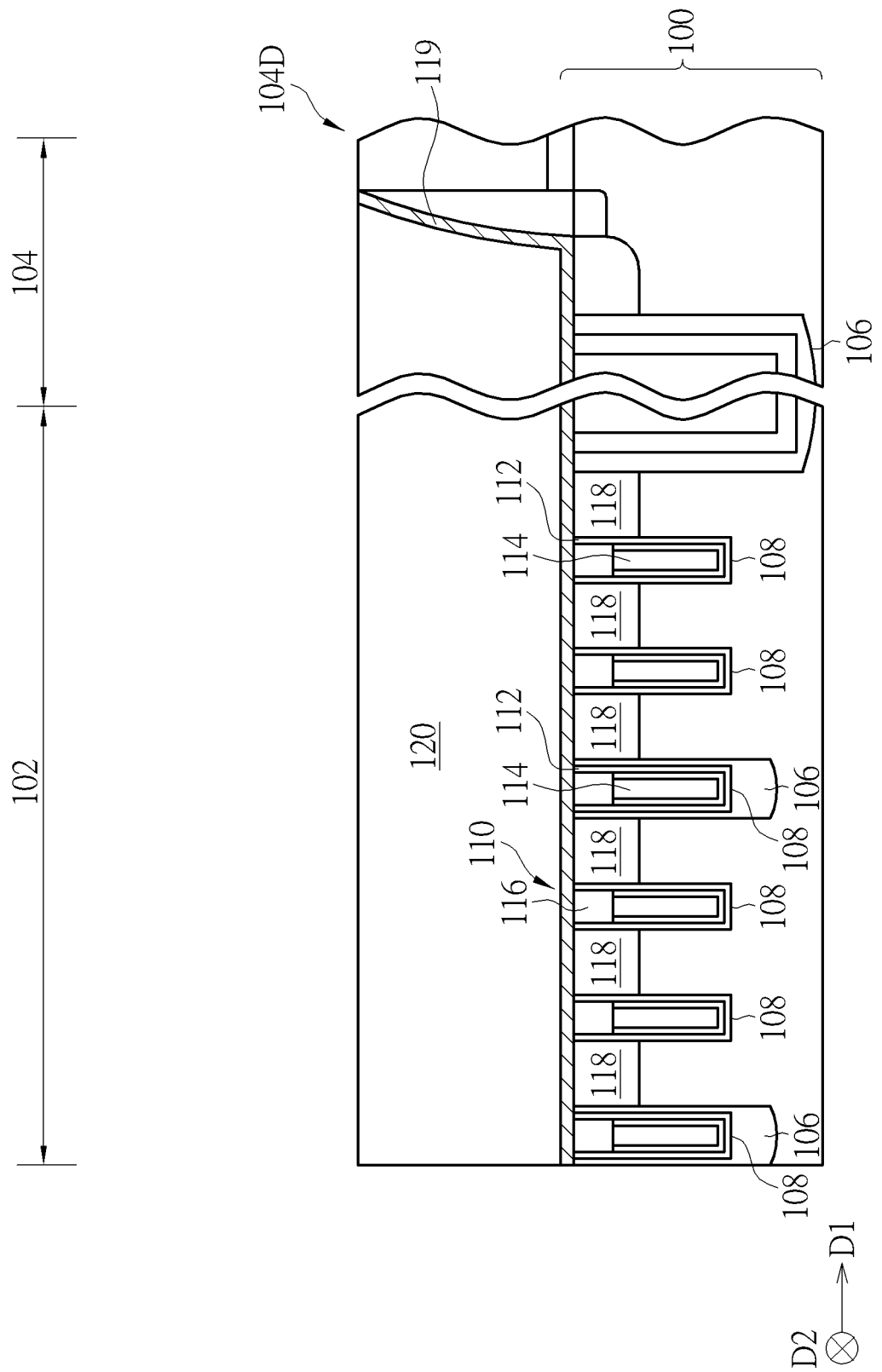

Please refer to FIGS. 1A-7, which are schematic drawings illustrating a method for forming a semiconductor device provided by a first preferred embodiment of the present invention, wherein FIGS. 1A-6A are plan views and FIGS. 1B-6B are cross-sectional views taken along a Line A-A' of FIGS. 1A-6A, respectively. As shown in FIGS. 1A and 1B, the method for forming the semiconductor device provides a substrate 100 including at least a memory cell region 102 and a peripheral region 104 defined therein. And a plurality of memory cells 110 are formed in the memory cell region 102. In the preferred embodiment, the memory cells 110 preferably include DRAM cells, but not limited to this.

Please refer to FIG. 1B. In some embodiments of the present invention, the memory cells 110 can be formed by the following step. A plurality of shallow trench isolation (hereinafter abbreviated as STI) structures 106 are formed in the substrate 100 in the memory region 102 and the peripheral region 104. The STI structures 106 are formed to define regions for accommodating transistor devices and to provide electrical isolations between those devices. Next, a plurality of recesses 108 are formed in the substrate 100 and the STI structures 106 in the memory region 102. A dielectric layer 112 is then formed to cover sidewalls and bottoms of the recesses 108. Thereafter, a buried gate 114 is formed in each recess 108 and followed by forming an insulating layer 116 to seal each recess 108. Next, a source/drain region 118 is formed in the substrate 100 at two sides of the buried gates 114. It is noteworthy that the buried gates 114 are arranged along a first direction D1 and extended along a second direction D2, and the first direction D1 and the second direction D2 are perpendicular to each other. Consequently, the memory cells 110 are formed in the substrate 100 in the memory region 102. However, those skilled in the art would easily realize that the memory cells 110 can be formed by any other suitable processes, and thus steps for forming the memory cells are not limited to this. After forming the memory cells 110, transistor device(s) 104D can be formed in the peripheral region 104 and followed by forming an etch stop layer 119 on the substrate 100, as shown in FIG. 1B. It should be understood that the source/drain regions 118 of the memory cells 110 in the memory region 102 and source/drain region (not shown) of the transistor device 104D in the peripheral region 104 can be formed simultaneously or sequentially, and those details are omitted in the interest of brevity.

Please still refer to FIG. 1A. After forming the memory cells 110 and the transistor device 104D, a first insulating layer 120 is formed on the substrate 100 and a plurality of bit line structures 130 are subsequently formed in the first insulating layer 120. The first insulating layer 120 includes a first insulating material, and the first insulating material can be, for example but not limited to, silicon oxide (SiO). As shown in FIG. 1A, the bit line structures 130 can include a plurality of bit line contact plugs 132, a plurality of bit lines 134 electrically connected to the bit line contact plugs 132, a plurality of spacers 136 formed on sidewalls of the bit lines 134, and a plurality of capping layers 138 formed on tops of the bit lines 134. Also as shown in FIG. 1A, the bit line structures 130 are extended along the first direction D1 and arranged along the second direction D2. It is noteworthy that the spacers 136 and the capping layers 138 of the bit line structures 130 include a second insulating material different from the first insulating material. The second insulating material can include, for example but not limited to, silicon nitride (SiN) or silicon carbon nitride (SiCN).

Figure 2A:
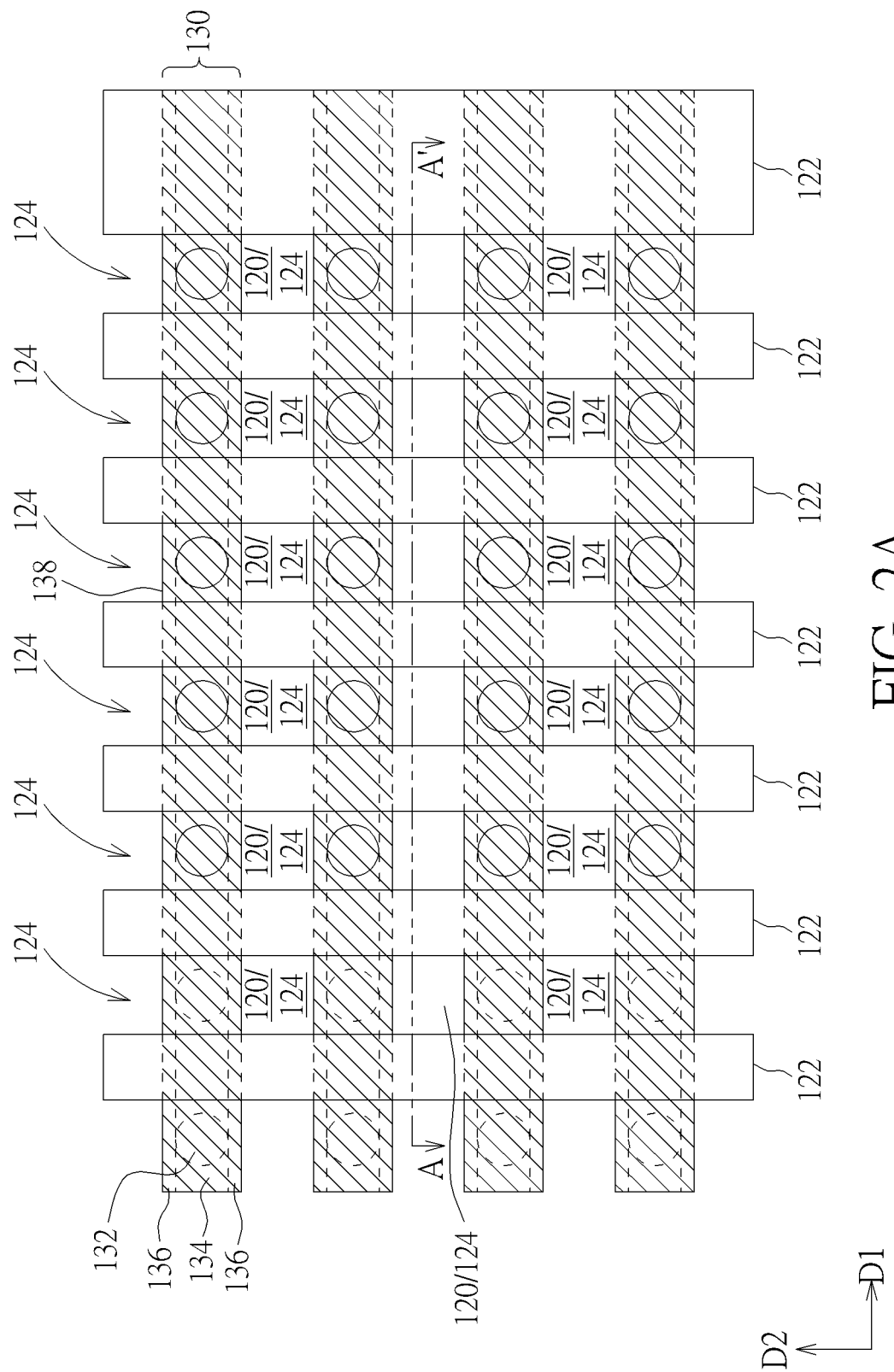
Figure 2B:
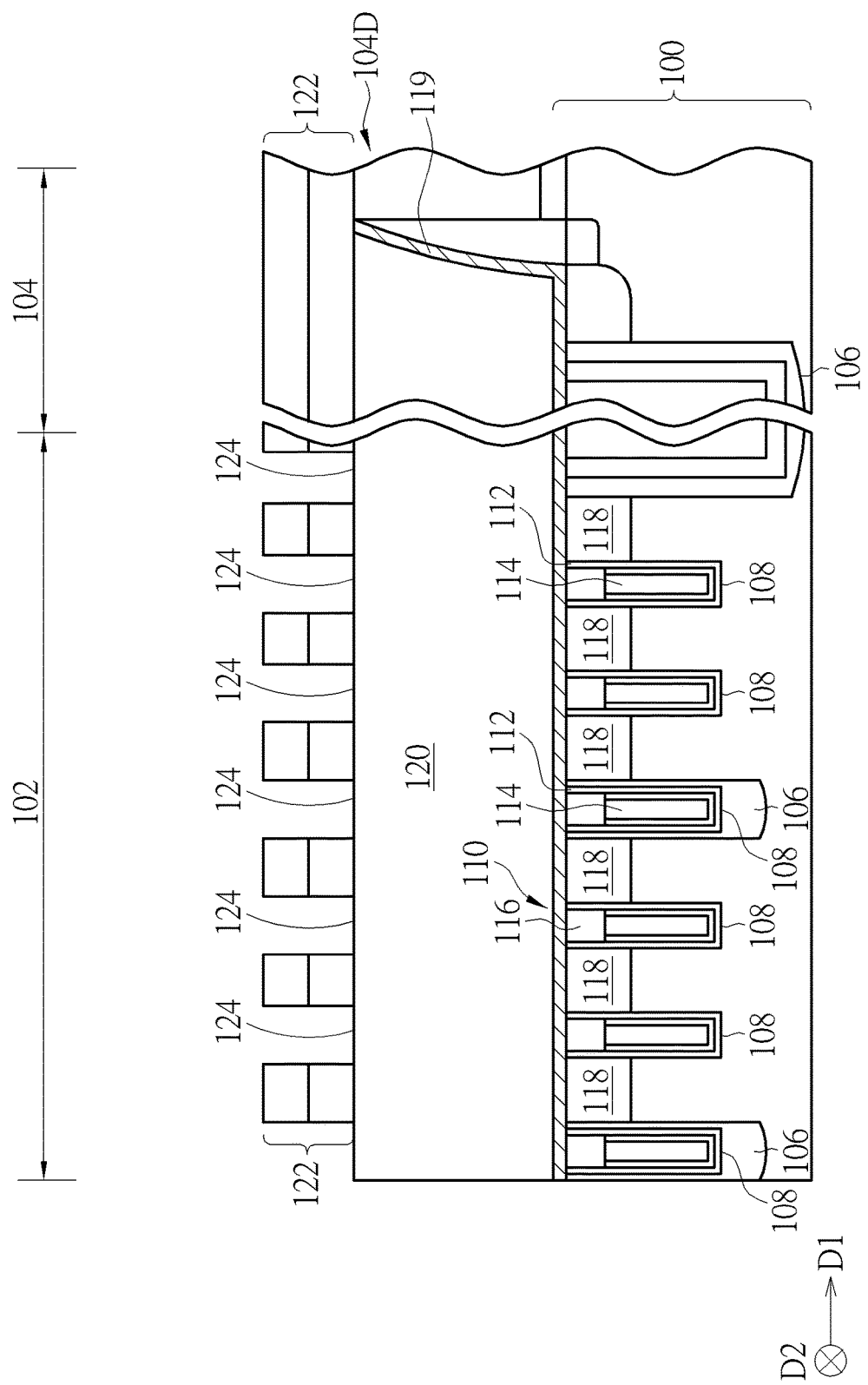
Figure 3A:
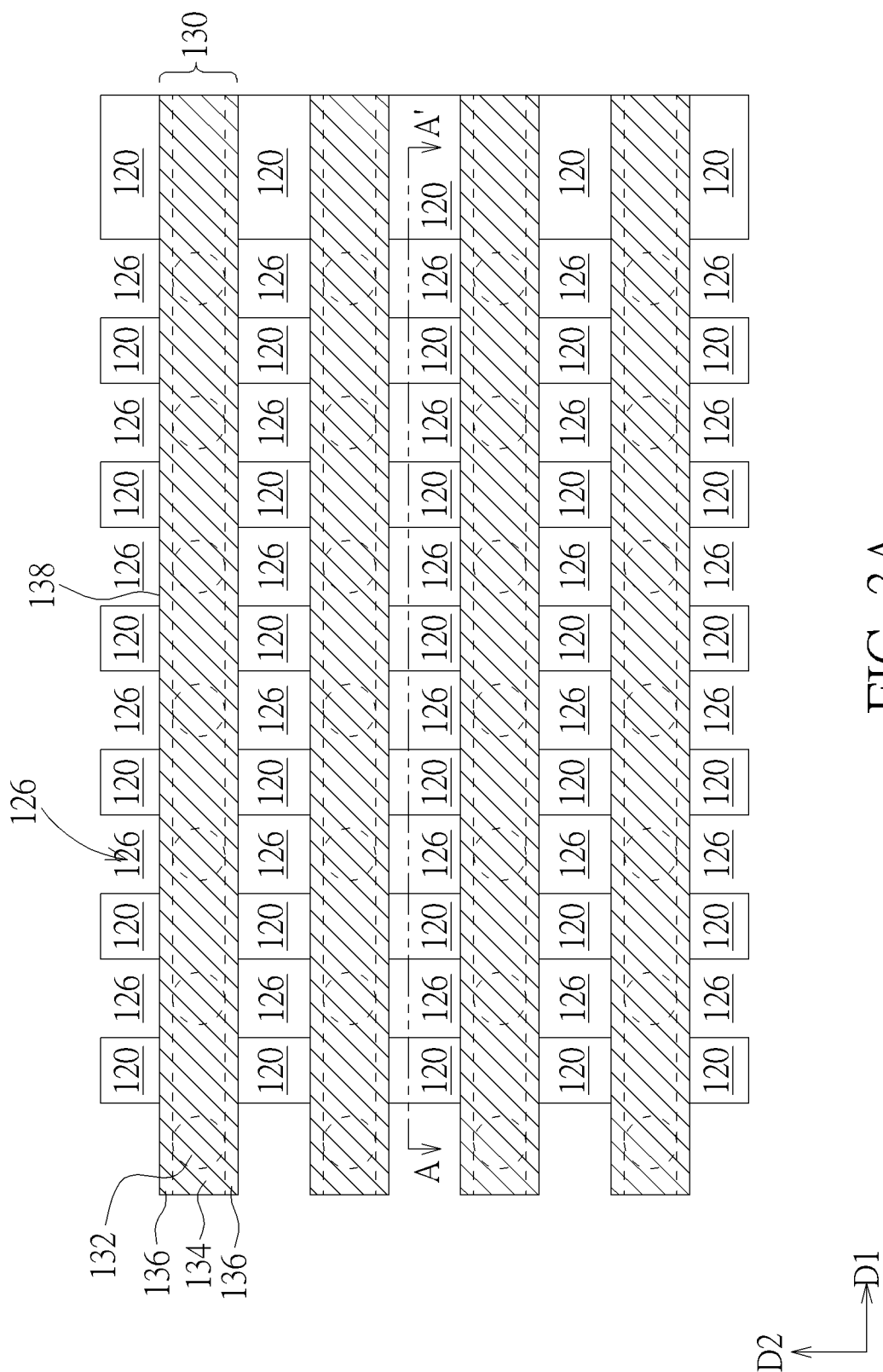
Figure 3B:
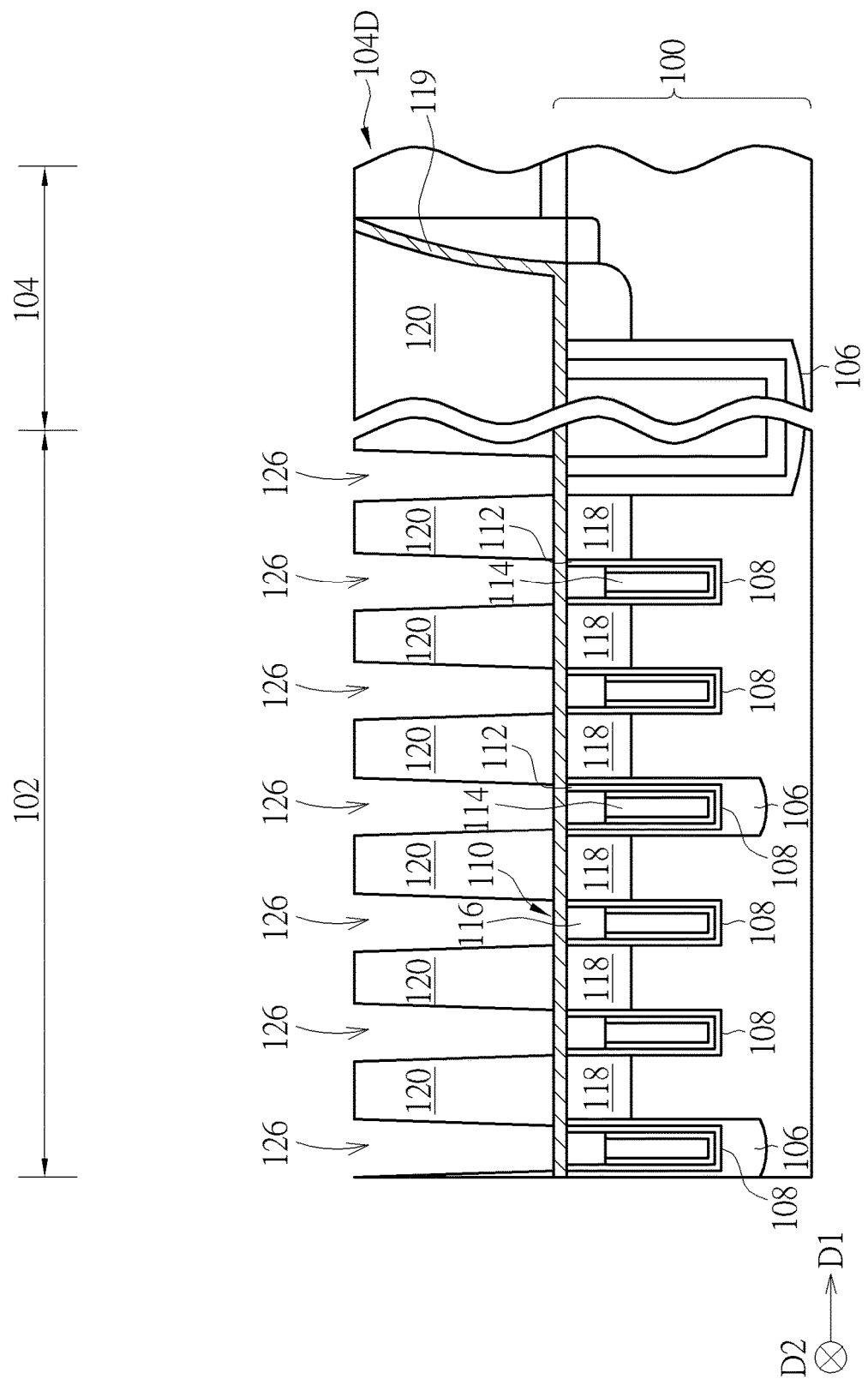

Please refer to FIGS. 2A-3B. Next, a plurality of first mask patterns 122 are formed on the substrate 100. The first mask patterns 122 are extended along the second direction D2 and arranged along the first direction D1. Consequently, the first mask patterns 122 expose portions of the first insulating layer 120. In other words, a plurality of first exposed portions 124 of the first insulating layer 120 are formed. It is noteworthy that the first exposed portions 124 are formed correspondingly to the buried gates 114 as shown in FIGS. 2A and 2B. After forming the first exposed portions 124 of the first insulating layer 120, the first exposed portions 124 are removed such that a plurality of openings 126 are formed in the first insulating layer 120, as shown in FIGS. 3A and 3B. And the first mask patterns 122 are removed.

Figure 4A:
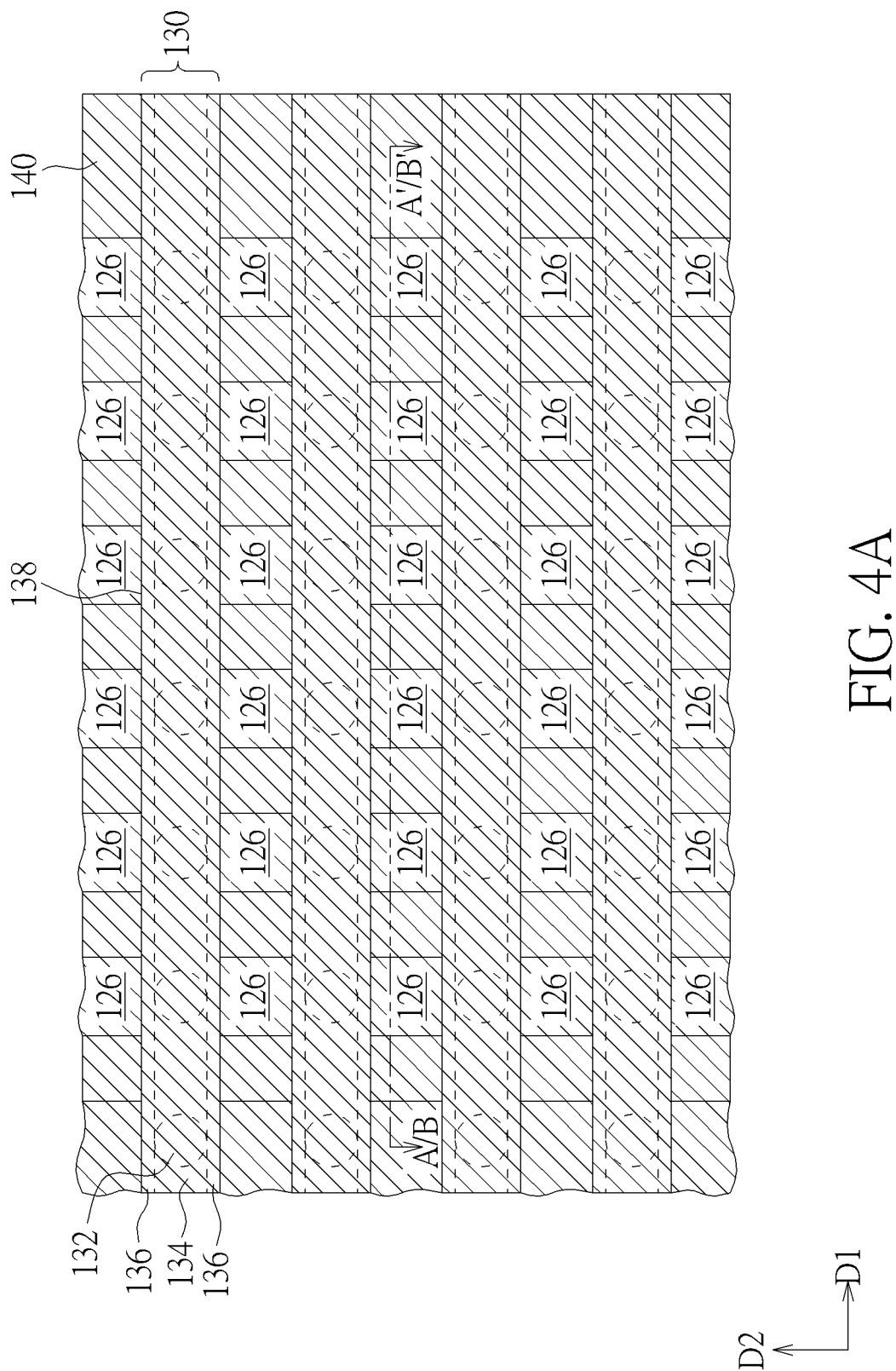
Figure 4B:
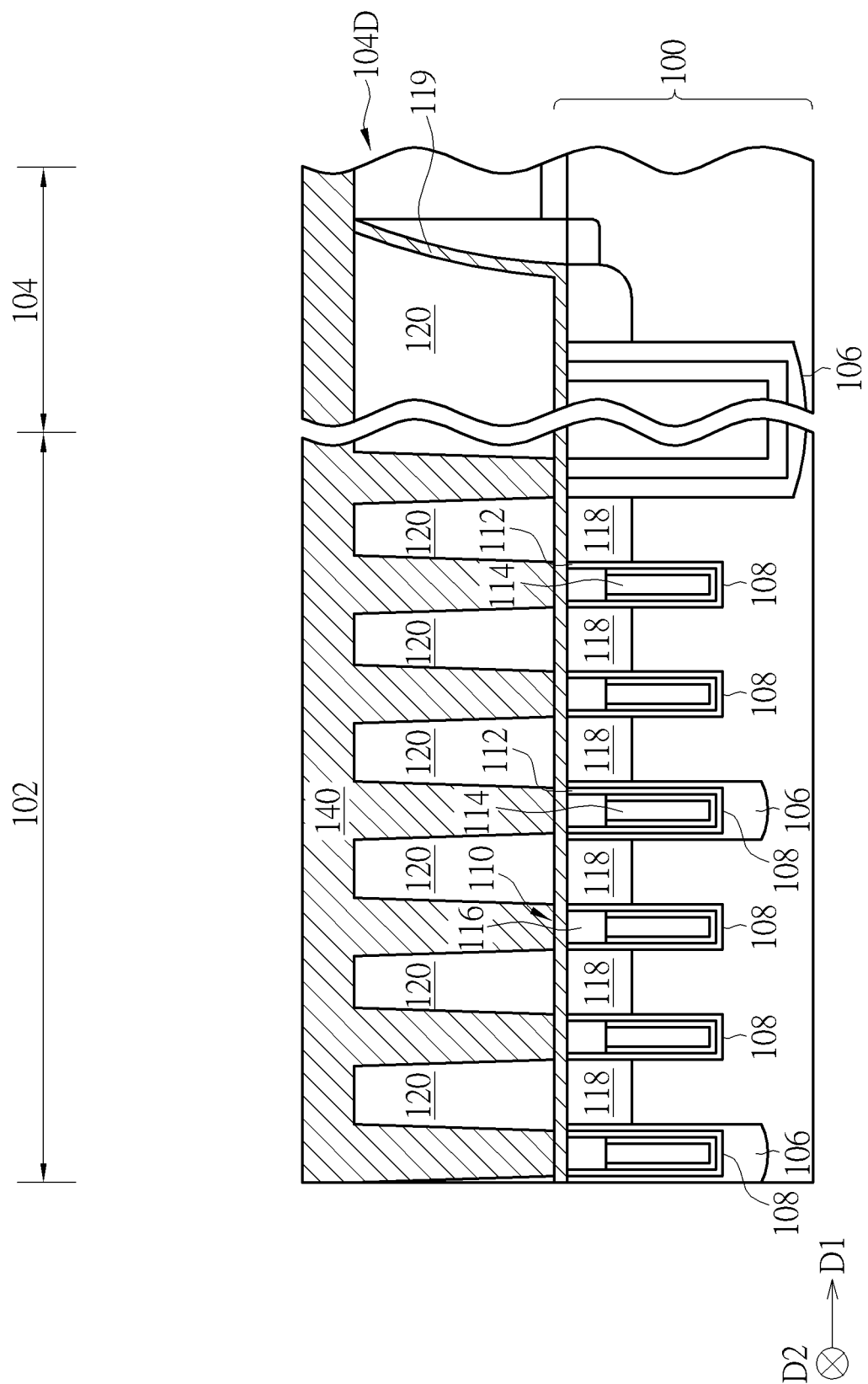

Please refer to FIGS. 4A and 4B. After forming the openings 126, a second insulating layer 140 is formed on the substrate 100. The second insulating layer 140 fills up the openings 126 and entirely covers a surface of the first insulating layer 120 and surfaces of the bit line structures 130. It is noteworthy that the second insulating layer 140 includes the second insulating material. In other words, the spacers 136 and the capping layers 138 of the bit line structures 130 and the second insulating layer 140 can include the same insulating material. It is found that the second insulating material is consumed during removing the first exposed portions 124 of the first insulating layer 120 even though the etching rates of the first insulating material and the second insulating material are different because the depth of the openings 126 is large. In other words, the capping layer 138 and the spacers 136 of the bit line structures 130 are damaged during forming the openings 126. However, the second insulating layer 140 is formed to fill up the openings 126 in accordance with the preferred embodiment, damages to the capping layers 138 and the spacers 136 of the bit line structures 130 are therefore repaired and remedied by the second insulating layer 140. Thus it is ensured that the bit line contact plugs 132 and the bit lines 134 of the bit line structures 130 are securely protected.

Figure 5A:
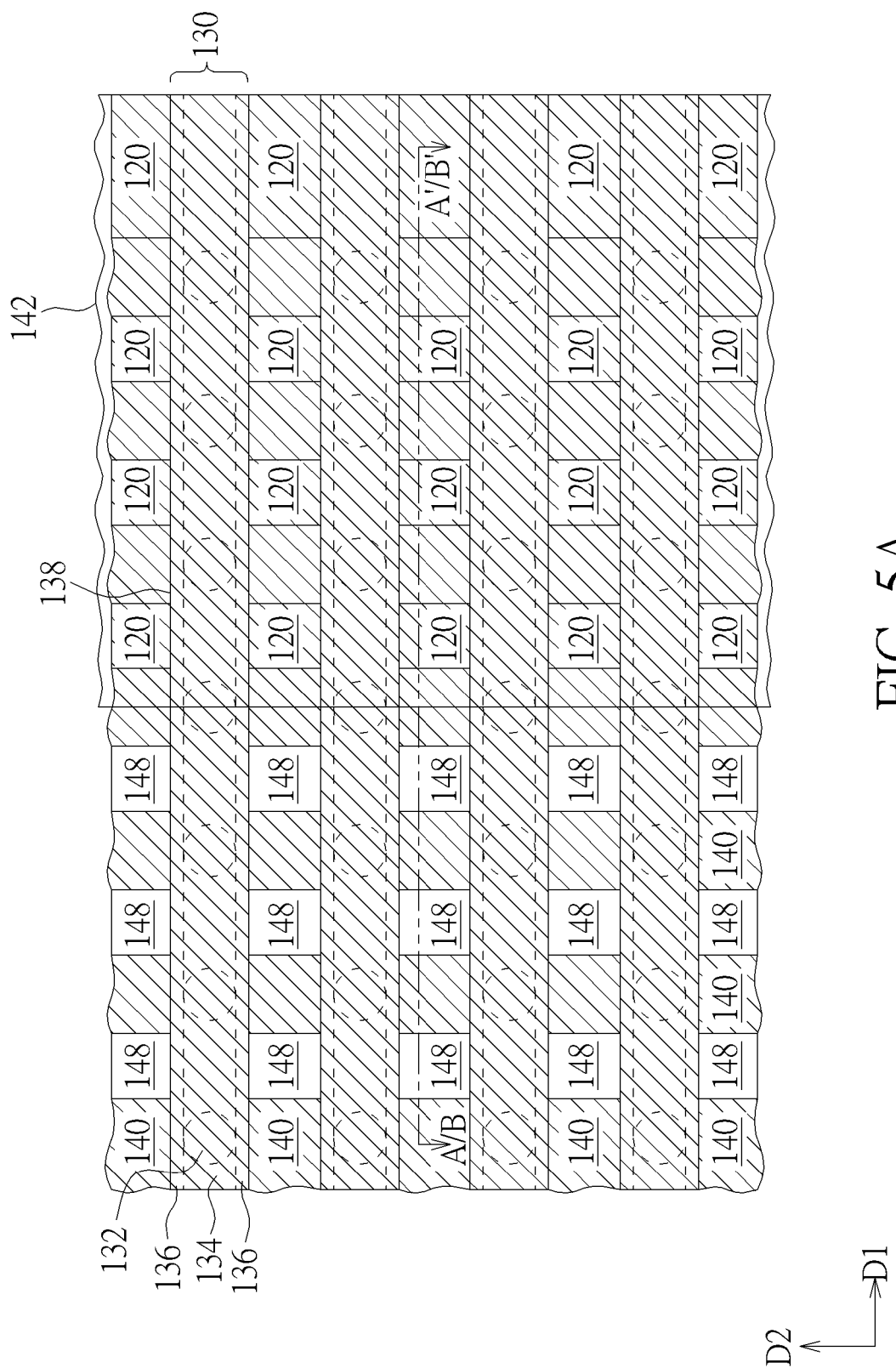
Figure 5B:
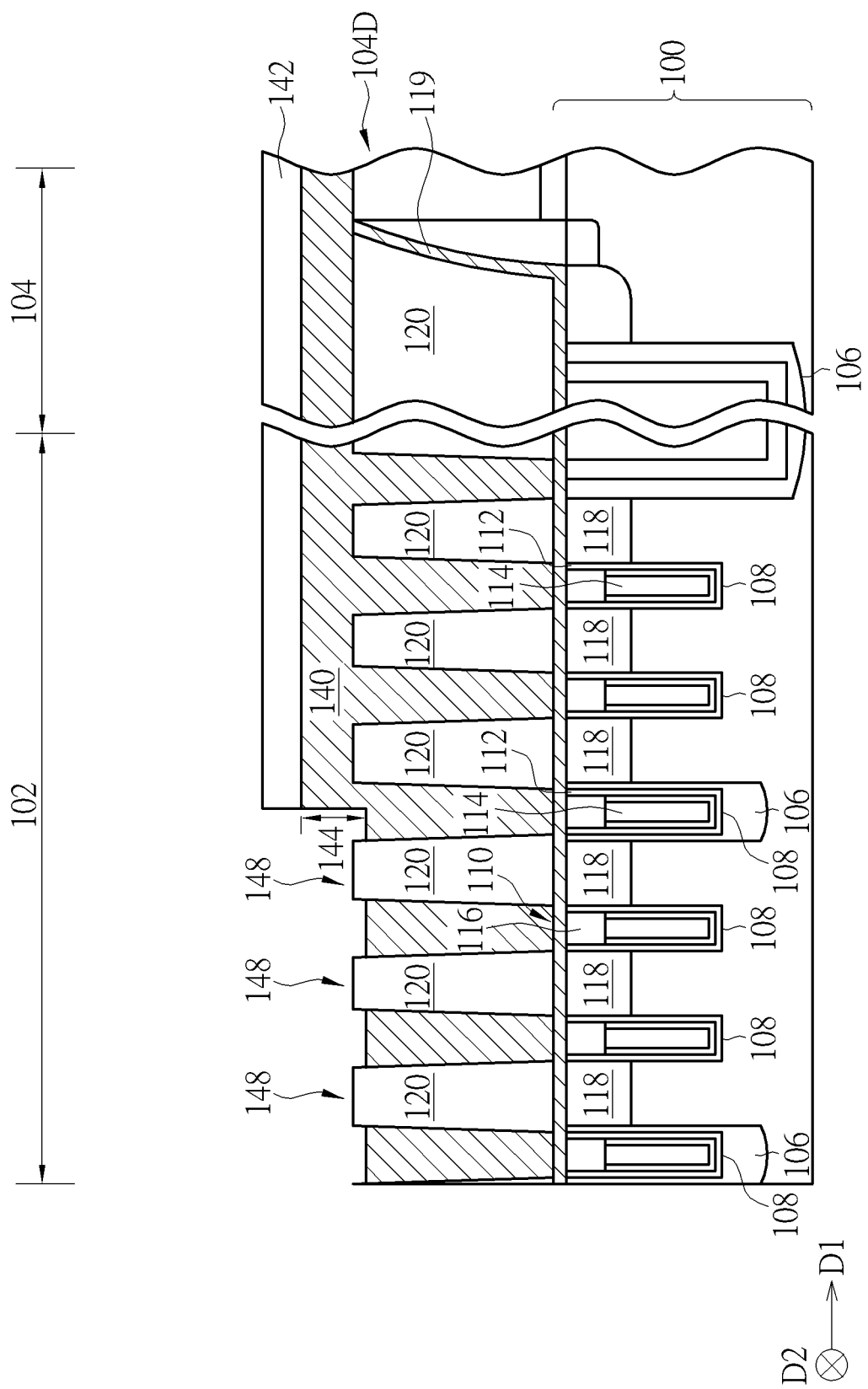

Please refer to FIGS. 5A and 5B. After forming the second insulating layer 140, a second mask pattern 142 exposing a portion of the second insulating layer 140 is formed in the memory cell region 102. Next, the exposed portion of the second insulating layer 140 is removed to form a plurality of second exposed portions 148 of the first insulating layer 120, and then the second mask pattern 142 is removed. Furthermore, since only the exposed portion of the second insulating layer 140 is removed from the memory cell region 102, a step height 144 is obtained on the top surface of the second insulating layer 140 in the memory cell region 102 according to the preferred embodiment, as shown in FIG. 5B.

Figure 6A:
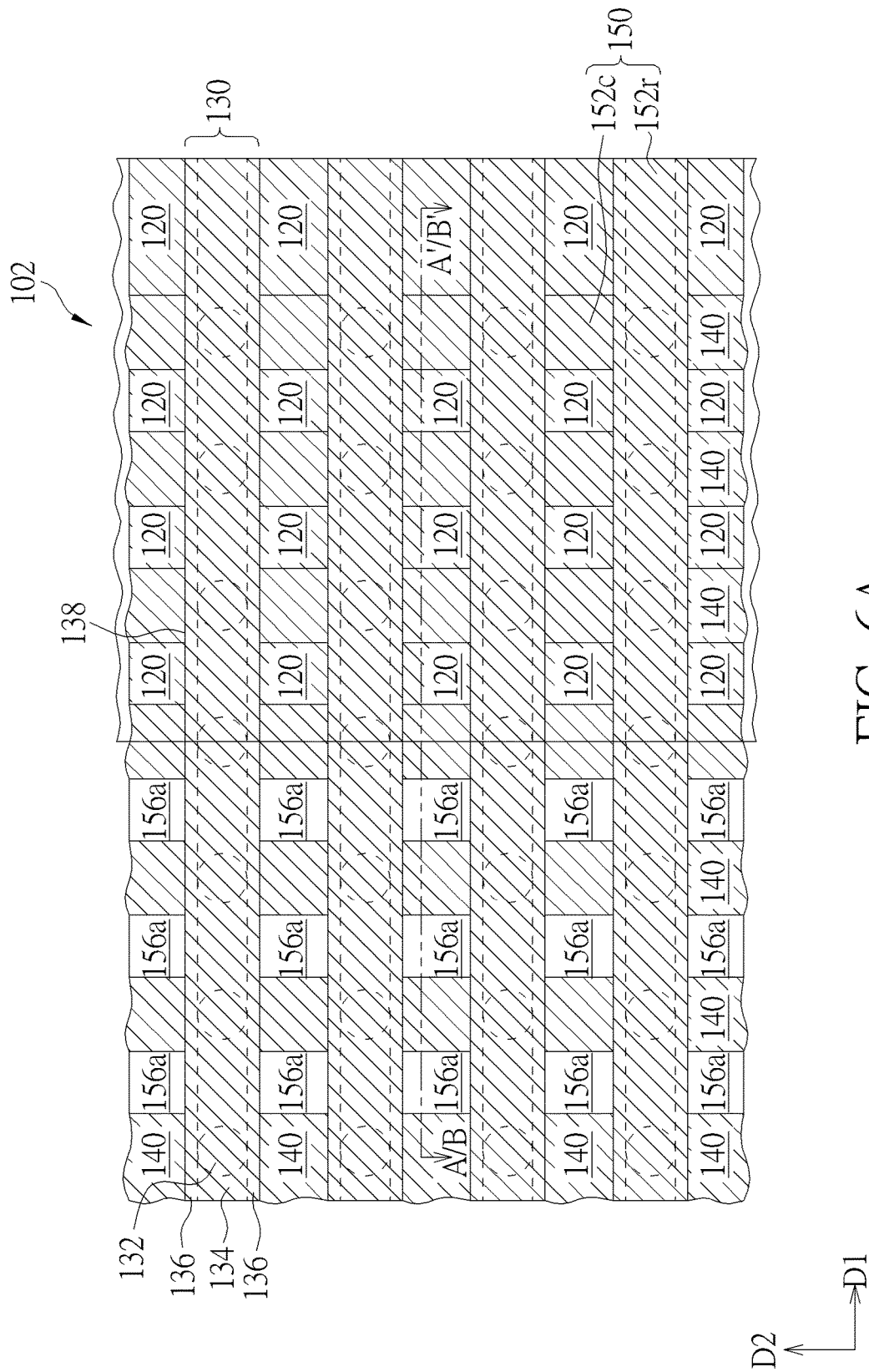
Figure 6B:
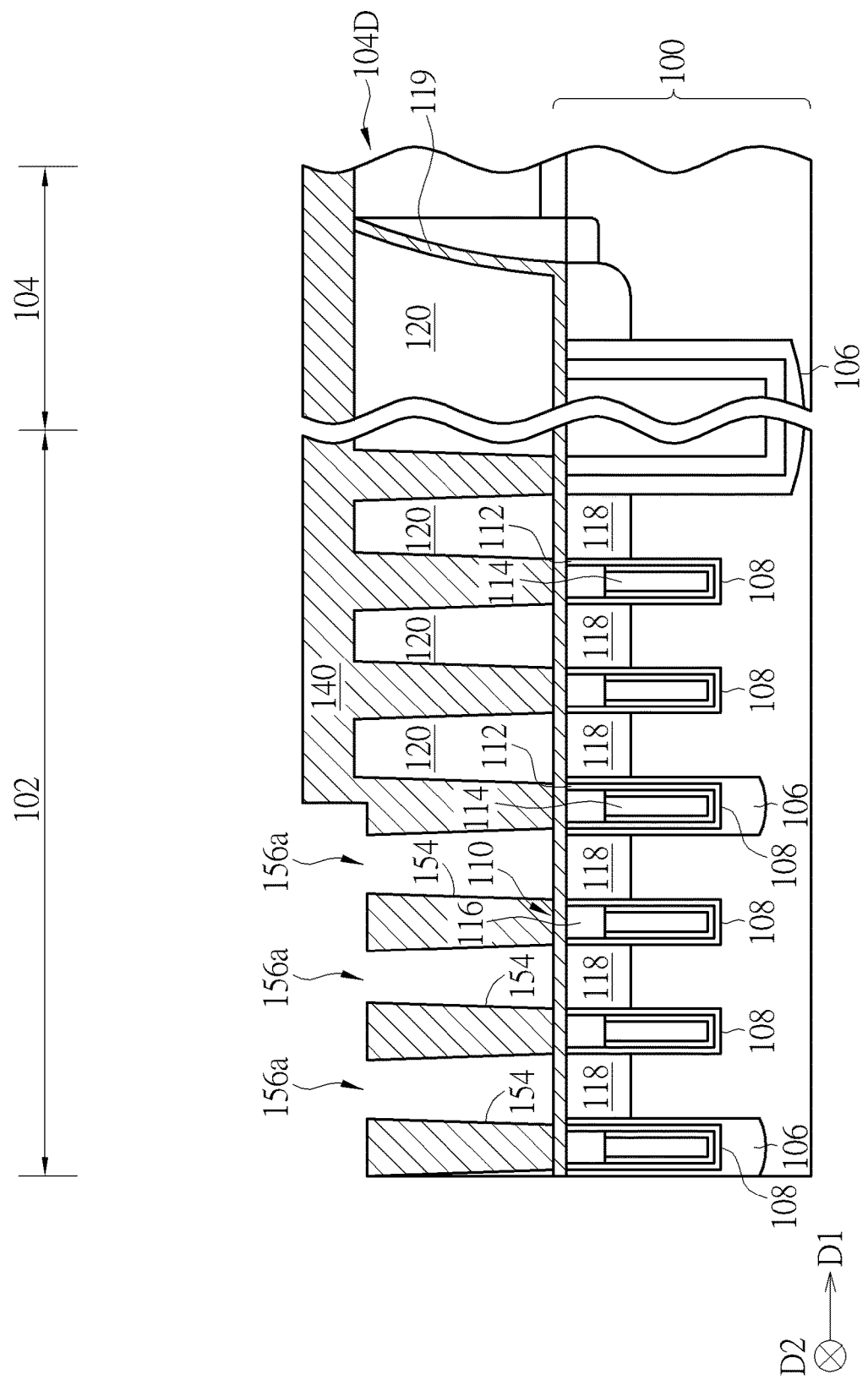

Please refer to FIGS. 6A and 6B. Next, the second exposed portions 148 of the first insulating layer 120 are removed and an isolation mesh 150 is formed on the substrate 100. The isolation mesh 150 includes a plurality of column ribs 152c and a plurality of row ribs 152r. Please refer to FIG. 6A. In detail, the spacers 136 and the capping layers 138 of the bit line structures 130 form the row ribs 152r of the isolation mesh 150, and the second insulating layer 140 forms the column ribs 152c of the isolation mesh 150. It is concluded that the bit line contact plugs 132 and the bit lines 134 of the bit line structures 130 are formed within the row ribs 152r of the isolation mesh 150. Furthermore, the spacers 136 and the second insulating layer 140 form a plurality of dielectric sidewalls 154 (shown in FIG. 6B) of the isolation mesh 150. It is noteworthy that since the spacers 136 and the second insulating layer 140 both include the second insulating material, the spacers 136 and the second insulating layer 140 form essentially homogeneous dielectric sidewalls 154. Furthermore, the column ribs 152c of the isolation mesh 150 also include the second insulating material, therefore the column ribs 152c of the isolation mesh 150 and the dielectric sidewalls 154 are essentially homogeneous. In this disclosure, "substantially homogeneous" may refer to having a substantially constant property, such as etching rate, or refer to being substantially uniform in composition and, thus, properties. More important, a plurality of apertures 156a are defined by the dielectric sidewalls 154 of the isolation mesh 150. The apertures 156a are corresponding to the source regions 118 of the memory cells 110, as shown in FIG. 6B. And the second pattern mask 142 is removed after forming the isolation mesh 150.

Figure 7:
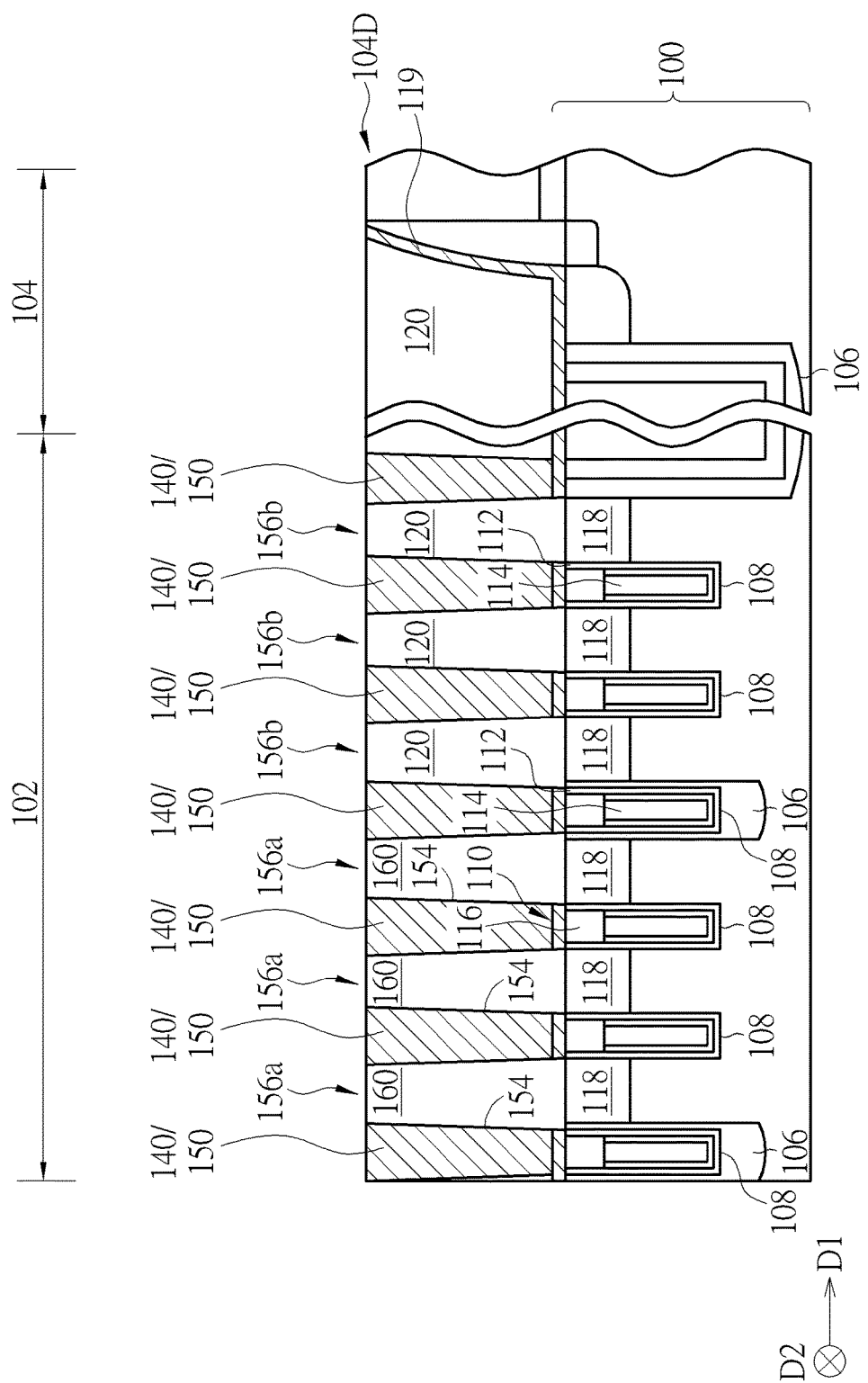

Please refer to FIG. 7. After forming isolation mesh 150, the etch stop layer 119 exposed at bottoms of the apertures 156a is removed to expose the source regions 118 of the memory cells 110. Subsequently, a storage node (hereinafter abbreviated as SN) contact plug 160 is respectively formed in each aperture 156a of the isolation mesh 150. More important, the bit lines 134 are physically spaced apart and electrically isolated from the SN storage nodes 160 by the dielectric sidewalls 154. According to the preferred embodiment, the SN contact plugs 160 can include a multiple structure. For example but not limited to, the SN contact plugs 160 can include an amorphous silicon layer and a metal silicide layer. Thereafter, steps for forming storage node landing pads and capacitors can be performed.

Accordingly, the preferred embodiment provides a semiconductor device including the substrate 100, and the substrate 100 including at least the memory cell region 102. And the plurality of memory cells 110 are formed in the memory cell region 102. The semiconductor device further includes the isolation mesh 150 formed on the substrate 100 in the memory cell region 102. The isolation mesh 150 include the essentially homogeneous dielectric sidewalls 154 and the apertures 156a defined by the dielectric sidewalls 154. The semiconductor device further includes the SN contact plugs 160 respectively formed in the apertures 156a and electrically connected to the memory cells 110. As mentioned above, the memory cells 110 respectively include a buried gate 114 formed in the substrate 100 and the source regions 118 formed in the substrate 100 at the two opposite sides of the buried gate 114. The apertures 156a are formed correspondingly to the source regions 118 and thus the SN contact plugs 160 are electrically connected to the source regions 118, respectively, as shown in FIG. 7.

Please still refer to FIG. 7. It is noteworthy that the isolation mesh 150 further includes a plurality of apertures 156b defined by the dielectric sidewalls 154 and the first insulating layer 120 can be formed in the apertures 156b. In some modifications to the preferred embodiment, the apertures 156b and the first insulating layer 120 formed therein are arranged in a peripheral area of the memory cell region 102. In some modifications to the preferred embodiment, the apertures 156b and the first insulating layer 120 formed therein are further arranged in between the SN contact plugs 160 and the peripheral region 104, but not limited to this.

According to the method for forming the semiconductor device provided by the preferred embodiment, the first insulating layer 120 located at where electrical isolation supposed to be provided are removed to form the openings and followed by forming the isolation mesh 150 including the apertures 156a. Then, the SN contact plugs 160 are formed in the apertures 156a of the isolation mesh 150. It is therefore concluded that compared to the prior art that the apertures are formed at where the electrical connections are required and followed by forming the contact plugs in the apertures, the preferred embodiment provides a reverse process. More important, by forming the isolation mesh 150, damages to the capping layers 138 and the spacers 136 of the bit line structures 130 are repaired and remedied. Therefore electrical isolations between the bit line contact plugs 132/ the bit lines 134 and the SN contact plugs 160 are securely constructed. Briefly speaking, the preferred embodiment provides a method for forming the semiconductor device with improved yield.

Please refer to FIGS. 1A-4B and 8A-9B, which are schematic drawings illustrating a method for forming a semiconductor device provided by a second preferred embodiment of the present invention, wherein FIGS. 1A-4A and 8A-9A are plan views and FIGS. 1B-4B and 8B-9B are cross-sectional views taken along a Line B-B' of FIGS. 1A-4A, respectively. It should be noted that the method for forming the semiconductor device provided by the second preferred embodiment include some steps the same with the first preferred embodiment, such as steps shown in FIGS. 1A-4B, therefore those steps and materials used for forming the elements are omitted in the interest of brevity. As mentioned above, the method for forming the semiconductor device of the preferred embodiment first provides a substrate 100 including a memory cell region 102 and a peripheral region 104 defined therein, and a plurality of memory cells 110 are formed in the memory cell region 102. The memory cells 110 respectively include a buried gate 114 and source/drain regions 118 formed in the substrate 100 at two sides of the buried gates 114. Additionally, transistor device(s) 104D can be formed the peripheral region 104 after forming the memory cells 110 if required. Next, an etch stop layer 119 is formed on the substrate 100, as shown in FIG. 1B. A first insulating layer 120 and a plurality of bit line structures 130 are then formed on the substrate 100. The first insulating layer 120 includes a first insulating material. As shown in FIG. 1A, the bit line structures 130 can include bit line contact plugs 132, bit lines 134 electrically connected to the bit line contact plugs 132, spacers 136 formed at sidewalls of the bit lines 134, and capping layers 138 formed on tops of the bit lines 134. As shown in FIG. 1A, the bit line structures 130 are extended along a first direction D1 and arranged along a second direction D2, and the first direction D1 and the second direction D2 are perpendicular to each other. It is noteworthy that the spacers 136 and the capping layers 138 of the bit line structures 130 include a second insulating material, and the second insulating material is different from the first insulating material.

Please refer to FIGS. 2A-3B. Next, a plurality of first mask patterns 122 are formed on the substrate 100. The first mask patterns 122 are extended along the second direction D2 and arranged along the first direction D1. Consequently, the first mask patterns 122 expose portions of the first insulating layer 120. In other words, a plurality of first exposed portions 124 of the first insulating layer 120 are formed. It is noteworthy that the first exposed portions 124 are formed correspondingly to the buried gates 114, as shown in FIGS. 2A and 2B. After forming the first exposed portions 124 of the first insulating layer 120, the first exposed portions 124 are removed such that a plurality of openings 126 are formed in the first insulating layer 120, as shown in FIGS. 3A and 3B. And the first mask patterns 122 are removed.

Please refer to FIGS. 4A and 4B. After forming the openings 126, a second insulating layer 140 is formed on the substrate 100. The second insulating layer 140 fills up the openings 126 and entirely covers a surface of the first insulating layer 120 and surfaces of the bit line structures 130. It is noteworthy that the second insulating layer 140 includes the second insulating material. In other words, the spacers 136 and the capping layers 138 of the bit line structures 130 and the second insulating layer 140 can include the same insulating material. It is found that the second insulating material is consumed during removing the first exposed portions 124 of the first insulating layer 120 even though the etching rates of the first insulating material and the second insulating material are different because the depth of the openings 126 is large. In other words, the capping layer 138 and the spacers 136 of the bit line structures 130 are damaged during forming the openings 126. However, the second insulating layer 140 is formed to fill up the openings 126 in accordance with the preferred embodiment, damages to the capping layers 138 and the spacers 136 of the bit line structures 130 are therefore repaired and remedied by the second insulating layer 140. Thus it is ensured that the bit line contact plugs 132 and the bit lines 134 of the bit line structures 130 are securely protected.

Figure 8A:
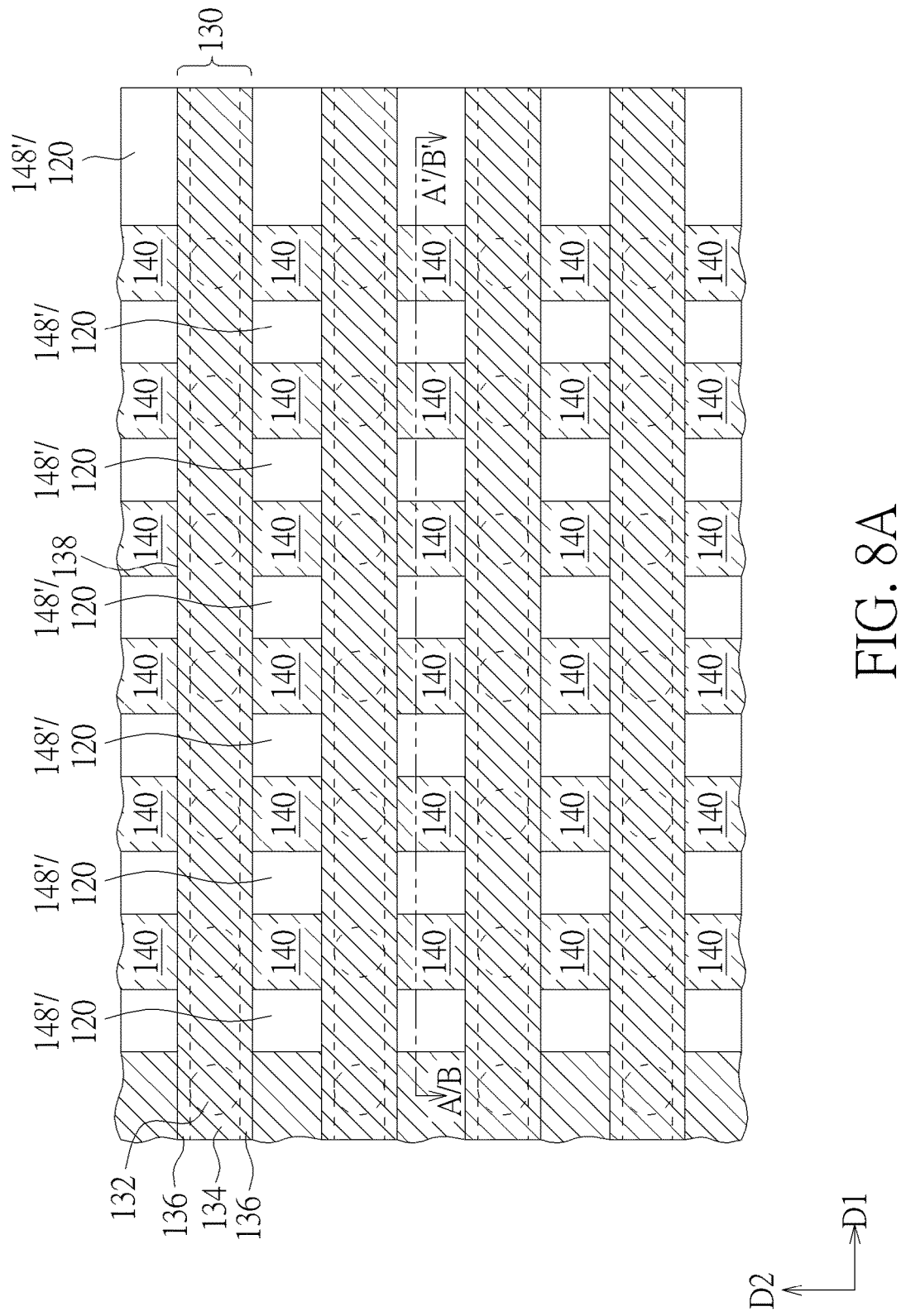
Figure 8B:
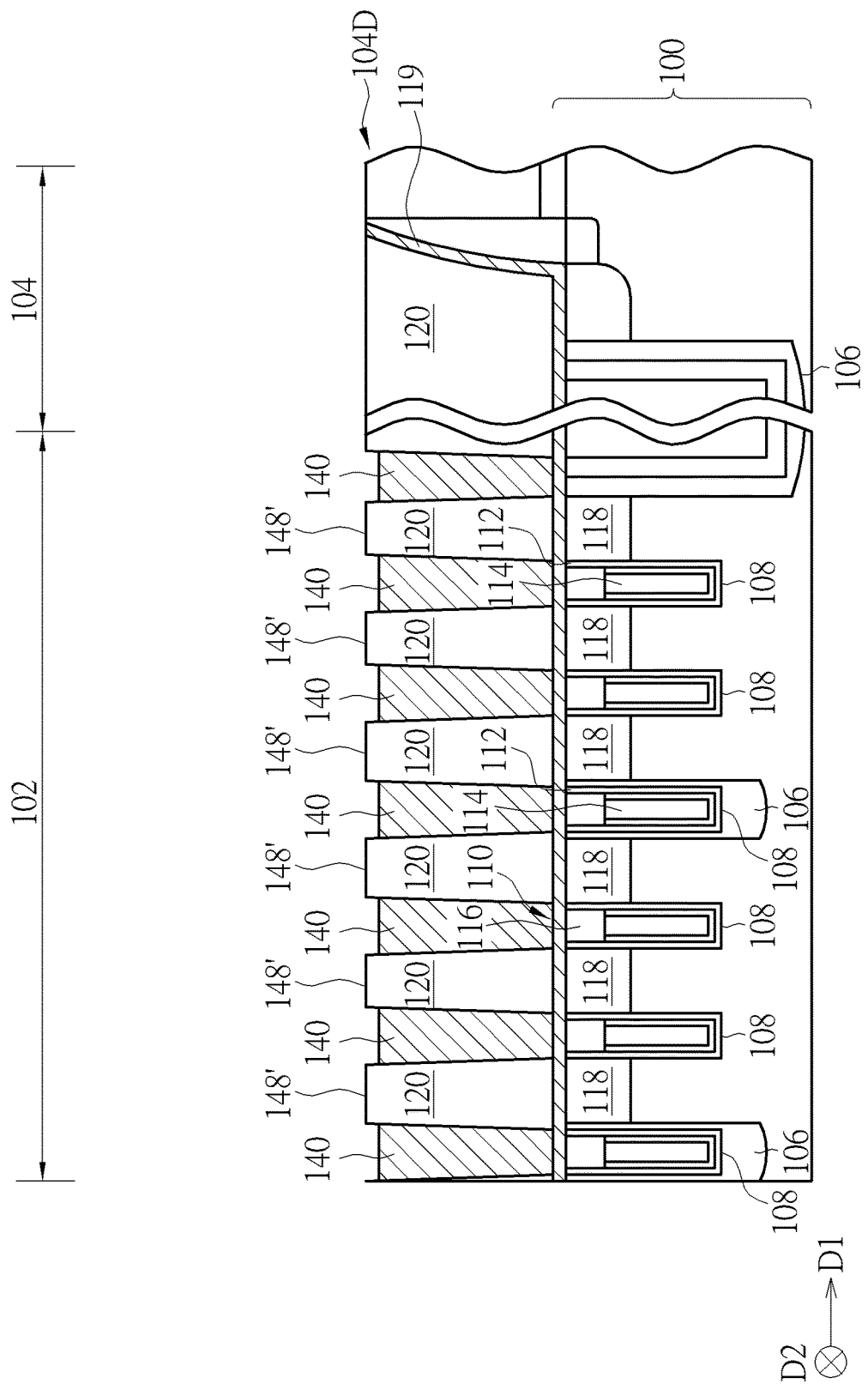

Please refer to FIGS. 8A and 8B. After forming the second insulating layer 140, a blanket etching is performed to the second insulating layer 140, consequently a portion of the second insulating layer 140 is removed and a plurality of second exposed portions 148' of the first insulating layer 120 are obtained. Since the overall height of the second insulating layer 140 is reduced, top surfaces of the second insulating layer 140 are coplanar after forming the second exposed portions 148' of the first insulating layer 120, as shown in FIG. 8B.

Figure 9A:
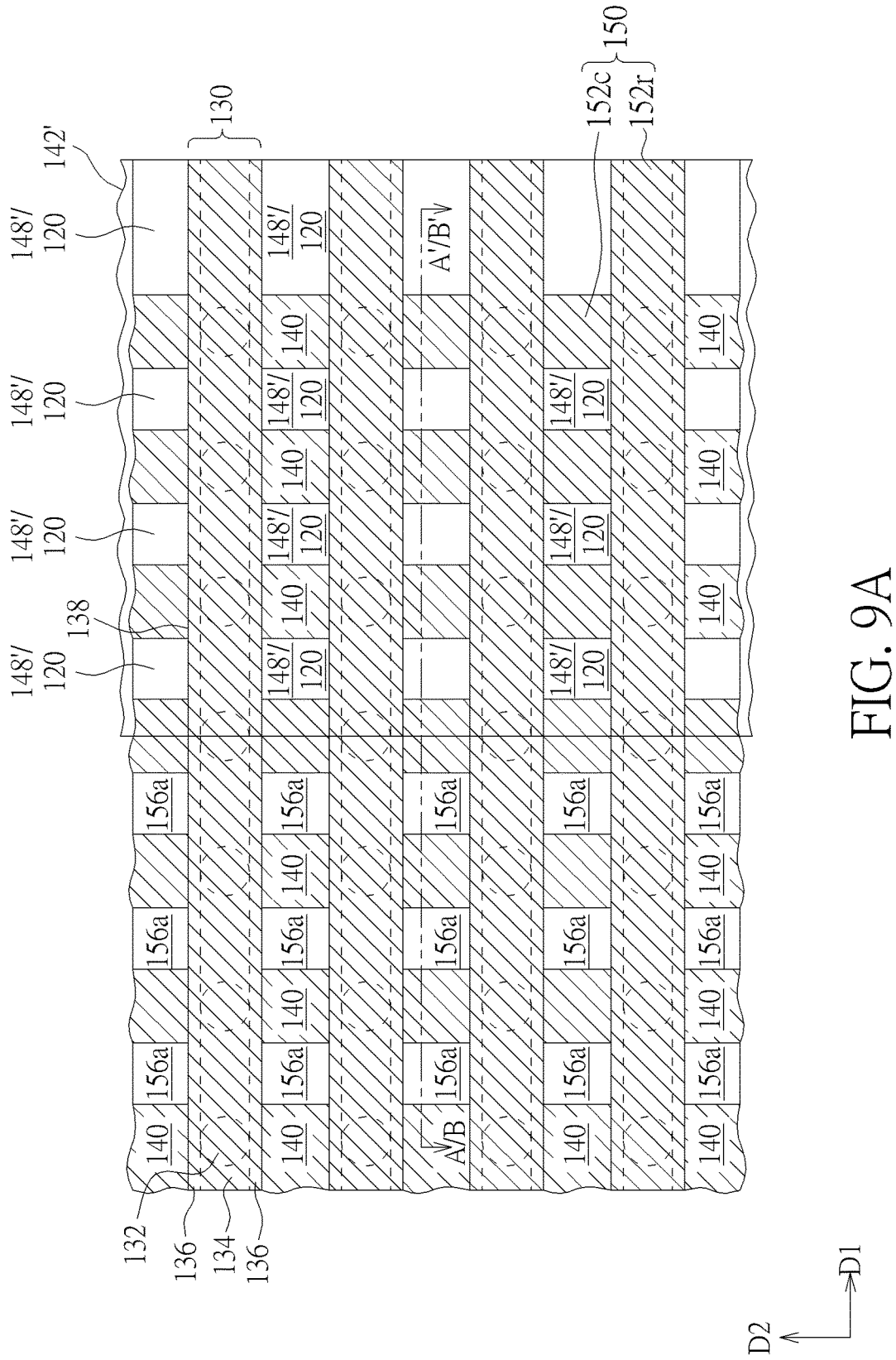
Figure 9B:
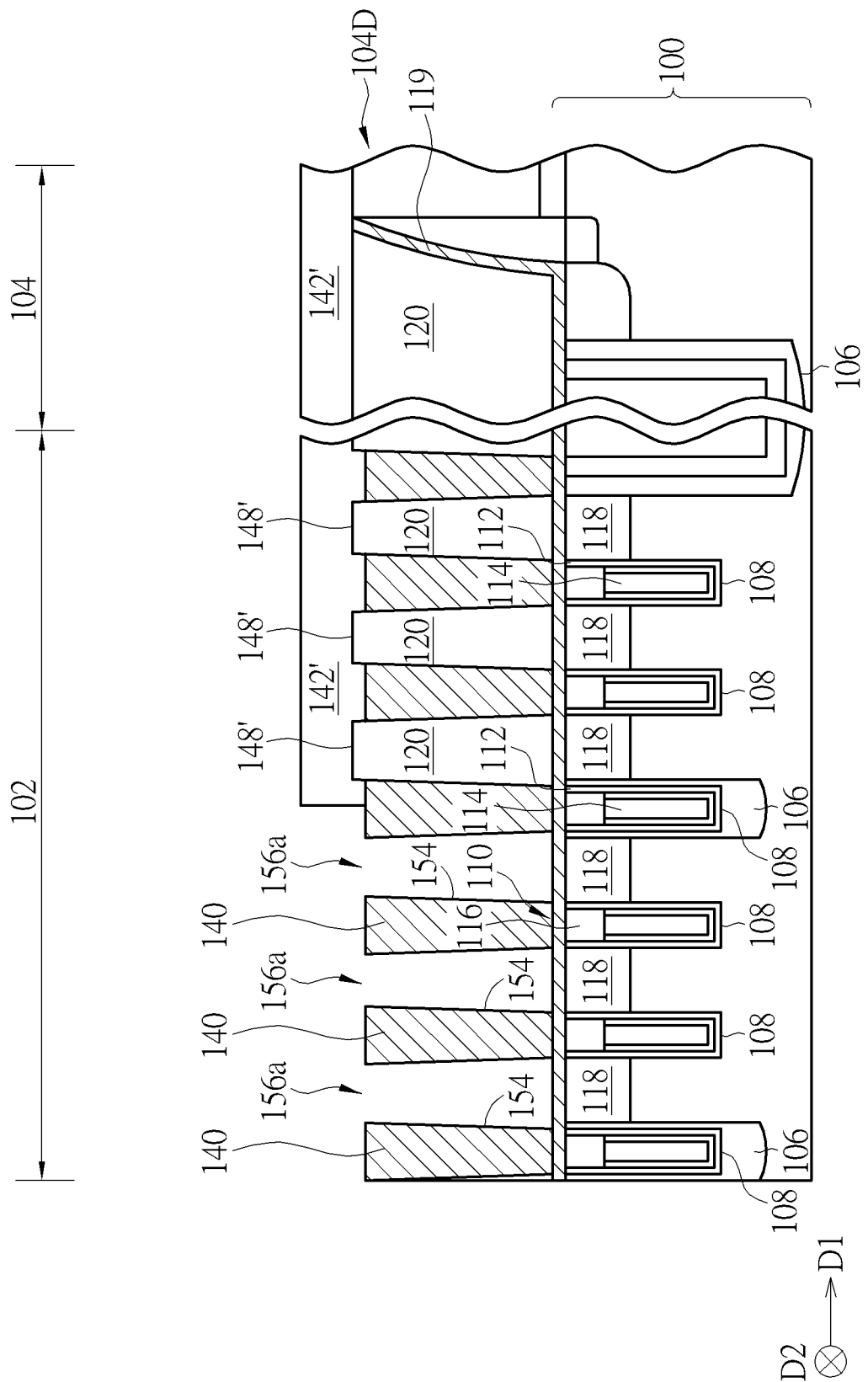

Please refer to FIGS. 9A and 9B. Next, a second mask pattern 142' is formed on the substrate 100 to cover portions of the second exposed portions 148' of the first insulating layer 120. And portions of the second exposed portions 148' not covered by the second mask pattern 142' are removed and thus an isolation mesh 150 is formed on the substrate 100. As mentioned above, the isolation mesh 150 includes a plurality of column ribs 152c and a plurality of row ribs 152r. Please refer to FIG. 9A. In detail, the spacers 136 and the capping layers 138 of the bit line structures 130 form the row ribs 152r of the isolation mesh 150 and the second insulating layer 140 forms the column ribs 152c of the isolation mesh 150. It is concluded that the bit line contact plugs 132 and the bit lines 134 of the bit line structures 130 are formed within the row ribs 152r of the isolation mesh 150. Furthermore, the spacers 136 and the second insulating layer 140 form a plurality of dielectric sidewalls 154 (shown in FIG. 9B) of the isolation mesh 150. It is noteworthy that since the spacers 136 and the second insulating layer 140 both include the second insulating material, the spacers 136 and the second insulating layer 140 form essentially homogeneous dielectric sidewalls 154. Furthermore, the column ribs 152c of the isolation mesh 150 also include the second insulating material, therefore the column ribs 152c of the isolation mesh 150 and the dielectric sidewalls 154 are essentially homogeneous. As mentioned above, "substantially homogeneous" may refer to having a substantially constant property, such as etching rate, to refer to being substantially uniform in composition and, thus, properties. More important, a plurality of apertures 156a are defined by the dielectric sidewalls 154 of the isolation mesh 150. The apertures 156a are corresponding to the source regions 118 of the memory cells 110, as shown in FIG. 9B. And the second mask pattern 142' is removed after forming the isolation mesh 150.

Please refer to FIG. 7 again. After forming the isolation mesh 150 as shown in FIG. 9B, the etch stop layer 119 exposed at bottoms of the apertures 156a is removed to expose the source regions 118 of the memory cells 110. Thereafter, a SN contact plug 160 is formed in each aperture 156a in the isolation mesh 150, and the SN contact plugs 160 are physically spaced apart and electrically isolated from the bit lint structures 130. According to the preferred embodiment, the SN contact plugs 160 can include a multiple structure. For example but not limited to, the SN contact plugs 160 can include an amorphous silicon layer and a metal silicide layer. Thereafter, steps for forming storage node landing pads and capacitors can be performed.

Accordingly, the preferred embodiment provides a semiconductor device including the substrate 100, and the substrate 100 including at least the memory cell region 102. And the plurality of memory cells 110 are formed in the memory cell region 102. The semiconductor device further includes the isolation mesh 150 formed on the substrate 100 in the memory cell region 102. The isolation mesh 150 include the essentially homogeneous dielectric sidewalls 154 and the apertures 156a defined by the dielectric sidewalls 154. The semiconductor device further includes the SN contact plugs 160 respectively formed in the apertures 156a and electrically connected to the memory cells 110. As mentioned above, the memory cells 110 respectively include a buried gate 114 formed in the substrate 100 and the source regions 118 formed in the substrate 100 at the two opposite sides of the buried gate 114. The apertures 156a are formed correspondingly to the source regions 118 and the SN contact plugs 160 are electrically connected to the source regions 118, as shown in FIG. 7.

Please still refer to FIG. 7. It is noteworthy that the isolation mesh 150 further includes a plurality of apertures 156b defined by the dielectric sidewalls 154 and the first insulating layer 120 can be formed in the apertures 156b. In some modifications to the preferred embodiment, the apertures 156b and the first insulating layer 120 formed therein are arranged in a peripheral area of the memory cell region 102. In some modifications to the preferred embodiment, the apertures 156b and the first insulating layer 120 formed therein are further arranged in between the SN contact plugs 160 and the peripheral region 104, but not limited to this.

According to the method for forming the semiconductor device provided by the preferred embodiment, the first insulating layer 120 located at where electrical isolation supposed to be provided are removed to form the openings and followed by forming the isolation mesh 150 including the apertures 156a. Then, the SN contact plugs 160 are formed in the apertures 156a of the isolation mesh 150. It is therefore concluded that compared to the prior art that the apertures are formed at where the electrical connections are required and followed by forming the contact plugs in the apertures, the preferred embodiment provides a reverse process. More important, by forming the isolation mesh 150, damages to the capping layers 138 and the spacers 136 of the bit line structures 130 are repaired and remedied. Therefore electrical isolations between the bit line contact plugs 132/ the bit lines 134 and the SN contact plugs 160 are securely constructed. Briefly speaking, the preferred embodiment provides a method for forming the semiconductor device with improved yield.

According to the semiconductor device and the method for forming the same provided by the present invention, the isolation mesh including the apertures formed therein is formed on the substrate, and the storage node contact plugs are subsequently formed in the apertures in the isolation mesh. Since the storage node contact plugs are formed in the apertures defined by the isolation mesh, the storage node contact plugs are physically spaced apart and electrically isolated from the bit lines and the bit line contact plugs by the isolation mesh. Briefly speaking, according to the method for forming the semiconductor device provided by the present invention, process yield is improved. More important, the semiconductor device provided by the present invention includes superior performance even when DRAM become more integrated and miniaturized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
 a substrate comprising at least a memory cell region defined therein and a plurality of memory cells being formed in the memory cell region;
 an isolation mesh formed on the substrate, the isolation mesh comprising a plurality of column ribs and a plurality of row ribs in a plan view as essentially homogeneous dielectric sidewalls and a plurality of first apertures defined by the dielectric sidewalls; and
 a plurality of storage node contact plugs formed in the first apertures and electrically connected to the memory cells, respectively.

2. The semiconductor device according to claim 1, further comprising a plurality of buried gates formed in the substrate and a plurality of source regions formed in the substrate at two sides of the buried gates.

3. The semiconductor device according to claim 2, wherein the first apertures respectively are formed correspondingly to the source regions, and the storage node contact plugs respectively are electrically connected to the source regions.

4. The semiconductor device according to claim 1, further comprising a plurality of bit line structures for forming the row ribs.

5. The semiconductor device according to claim 1, wherein the dielectric sidewalls essentially consist of silicon nitride (SiN) or silicon carbon nitride (SiCN).

6. The semiconductor device according to claim 1, wherein the isolation mesh further comprising a plurality of second apertures defined by the dielectric sidewalls.

7. The semiconductor device according to claim 6, further comprising a plurality of insulating layers formed in the second apertures, and an etching rate of the insulating layers being different from an etching rate of the dielectric sidewalls.

8. A method for forming the semiconductor device, comprising:
 providing a substrate comprising at least a memory cell region defined therein, and a plurality of memory cells being formed in the substrate, the substrate comprising a first insulating layer formed thereon and a plurality of bit line structures formed in the first insulating layer in the memory cell region, the first insulating layer comprising a first insulating material, the bit line structures being extended along a first direction and arranged along a second direction, and the first direction and the second direction being perpendicular to each other;
 forming a plurality of first mask patterns on the substrate, the first mask patterns being extended along the second direction and arranged along the first direction to form a plurality of first exposed portions of the first insulating layer;
 removing the first exposed portions of the first insulating layer to form a plurality of openings in the first insulating layer;
 forming a second insulating layer on the substrate to fill up the openings and to form a plurality of second exposed portions of the first insulating layer, and the second insulating layer comprising a second insulating material different from the first insulating material;

removing the second exposed portions of the first insulating layer to form an isolation mesh on the substrate, the isolation mesh comprising a plurality of essentially homogeneous dielectric sidewalls and a plurality of apertures defined by the dielectric sidewalls; and forming a plurality of storage node contact plugs in the apertures, respectively.

9. The method for forming the semiconductor device according to claim 8, wherein the memory cells respectively comprise a buried gate formed in the substrate.

10. The method for forming the semiconductor device according to claim 8, wherein the bit line structures comprise a plurality of bit lines, a plurality of bit line contact plugs, a plurality of spacers formed on sidewalls of the bit lines, and a plurality of capping layers formed on tops of the bit lines.

11. The method for forming the semiconductor device according to claim 10, wherein the spacers and the capping layers comprise the second insulating material.

12. The method for forming the semiconductor device according to claim 11, wherein the spacers and the capping layer form the row ribs of the isolation mesh, and the second insulating layer forms the column ribs of the isolation mesh.

13. The method for forming the semiconductor device according to claim 11, wherein the spacers and the second insulating layer form the dielectric sidewalls of the isolation mesh, and the bit lines are physically apart and electrically isolated from the storage node contact plugs by the dielectric sidewalls.

14. The method for forming the semiconductor device according to claim 8, wherein the step of forming the second insulating layer on the substrate to fill up the openings and to form the second posed portions of the first insulating layer further comprises:

forming the second insulating layer on the substrate, the second insulating layer filling up the openings and entirely covering a surface of the first insulating layer and surfaces of the bit line structures;

forming a second mask pattern in the memory cell region, the second mask pattern exposing portions of the second insulating layer; and removing the portions of the second insulating layer exposed by the second mask pattern to form the second exposed portions of the first insulating layer.

15. The method for forming the semiconductor device according to claim 14, wherein a top surface of the second insulating layer in the memory cell region comprises a step height after forming the second exposed portions of the first insulating layer.

16. The method for forming the semiconductor device according to claim 8, wherein the step of forming the second insulating layer on the substrate to fill up the openings and to form a plurality of second posed portions of the first insulating layer further comprises:

forming the second insulating layer on the substrate, the second insulating layer filling up the openings and entirely covering a surface of the first insulating layer and surfaces of the bit line structures;

removing portions of the second insulating layer in the memory cell region to form the second exposed portions of the first insulating layer; and forming a second mask pattern in the memory cell region to cover a portion of the second exposed portions of the first insulating layer.

17. The method for forming the semiconductor device according to claim 16, wherein the top surfaces of the second insulating layer are coplanar after forming the second exposed portions of the first insulating layer.

18. The method for forming the semiconductor device according to claim 16, wherein the second mask pattern is removed after forming the isolation mesh.

* * * * *